(12) United States Patent
Carter et al.

(10) Patent No.: US 7,947,801 B2
(45) Date of Patent: May 24, 2011

(54) POLYFLUORENE METHOD

(75) Inventors: Kenneth Raymond Carter, Hadley, MA (US); Sarav Bharat Jhaveri, Amherst, MA (US)

(73) Assignee: The University of Massachusetts, Boston, MA (US)

( * ) Notice: Subject to any disclaimer, the term of this patent is extended or adjusted under 35 U.S.C. 154(b) by 518 days.

(21) Appl. No.: 12/062,119

(22) Filed: Apr. 3, 2008

(65) Prior Publication Data

US 2008/0249282 A1  Oct. 9, 2008

Related U.S. Application Data

(60) Provisional application No. 60/909,860, filed on Apr. 3, 2007.

(51) Int. Cl.
*C08F 6/00* (2006.01)
*C08J 3/00* (2006.01)
*C08G 61/00* (2006.01)

(52) U.S. Cl. ........ 528/396; 528/397; 528/398; 528/485; 528/488; 528/492

(58) Field of Classification Search ................... 528/396, 528/485, 488, 492, 398, 397
See application file for complete search history.

(56) References Cited

U.S. PATENT DOCUMENTS 6,602,974 B1  8/2003  McCullough et al.

OTHER PUBLICATIONS

Heeger, A. J. Angewandte Chemie, International Edition 2001, 40, 2591-2611.
Scherf, U.; List, E. J. W. Advanced Materials (Weinheim, Germany) 2002, 14, 477-487.
Schulter, A. D. Journal of Polymer Science, Part A: Polymer Chemistry 2001, 39, 1533-1556.
Marsitzky et al., Journal of the American Chemical Society 2001, 123, 6965-6972.
Yamamoto, T. Progress in Polymer Science 1992, 17, 1153-1205.
Yamamoto, T. et al., Macromolecules 1992, 25, 1214-1223.
Bunz, U. H. F. Chemical Reviews (Washington, D. C.) 2000, 100, 1605-1644.
Loewe, R. S. et al., Macromolecules 2001, 34, 4324-4333.
Loewe, R. S. et al., Advanced Materials (Weinheim, Germany) 1999, 11, 250-253.
Kim, Y. et al., Journal of Polymer Science, Part A.: Polymer Chemistry 2005, 44, 172-182.
Cao, J. et al., Synthetic Metals 2005, 152, 237-240.
Zhou, G. et al., Macromolecules 2005, 38, 5416-5424.
Grisorio, R. et al., Macromolecular Chemistry and Physics 2005, 206, 448-455.
Lee, J. et al., Macromolecules 2004, 37, 8523-8529.
Tu, G. et al., Applied Physics Letters 2004, 85, 2172-2174.
Zhou, X.-H.; Yan, J.-C.; Pei, J. Macromolecules 2004, 37, 7078-7080.
Bozano, L. D. et al., Journal of Applied Physics 2003, 94, 3061-3068.
Cho, H.-J. et al., Macromolecules 2003, 36, 6704-6710.
Asawapirom, U.; Scherf, U. Macromolecular Rapid Communications 2001, 22, 746-749.
Lee, J.-I.; Klaerner, G.; Miller, R. D. Chemistry of Materials 1999, 11, 1083-1088.
Klaerner, G.; Miller, R. D. Macromolecules 1998, 31, 2007-2009.
Pei, Q.; Yang, Y. Journal of the American Chemical Society 1996, 118, 7416-7417.
Carter, K. R. Macromolecules 2002, 35, 6757-6759.
Van Tamelen, et al., Journal of the American Chemical Society 1965, 87, 4964-4965.
Van Tamelen, et al., Journal of the American Chemical Society 1971, 93, 6141-6144.
Pasynkiewicz, S.; Lehmkuhl, H. Journal of Organometallic Chemistry 1985, 289, 189-200.
Lehmkuhl, H.; Pasynkiewicz, S.; Benn, R.; Rufinska, A. Journal of Organometallic Chemistry 1982, 240, C27-C29.
Pietrzykowski, A.; Pasynkiewicz, S. Journal of Organometallic Chemistry 1992, 440, 401-409.
Inaba, S.; Matsumoto, H.; Rieke, R. D. Journal of Organic Chemistry 1984, 49, 2093-2098.
Kavaliunas, A. V.; Rieke, R. D. Journal of the American Chemical Society 1980, 102, 5944-5945.
Tamao, K.; Kiso, Y.; Sumitani, K.; Kumada, M. Journal of the American Chemical Society 1972, 94, 9268-9269.
Tamao, K.; Sumitani, K.; Kumada, M. Journal of the American Chemical Society 1972, 94, 4374-4376.
Kiso, Y.; Tamao, K.; Kumada, M. Journal of Organometallic Chemistry 1973, 50, C12-C14.
Minato, A.; Tamao, K.; Suzuki, K.; Kumada, M. Tetrahedron Letters 1980, 21, 4017-4020.
Kumada, M. Pure and Applied Chemistry 1980, 52, 669-679.

*Primary Examiner* — Duc Truong
(74) *Attorney, Agent, or Firm* — Cantor Colburn LLP

(57) ABSTRACT

A method of synthesizing a poly(9,9-disubstituted-fluorene) includes reacting a 9,9-disubstituted-fluorene with an alkyl lithium in the presence of a catalytic amount of a nickel amine complex. The 9,9-disubstituted-fluorene includes solubility-enhancing substituents in the 9-position and leaving groups in the 2-position and the 7-position. The product poly(9,9-disubstituted-fluorene)s are fluorescent conjugated polymers that are useful as, for example, blue light-emitting materials.

26 Claims, No Drawings

POLYFLUORENE METHOD

CROSS REFERENCE TO RELATED APPLICATION

This application claims the benefit of U.S. Provisional Patent Application Ser. No. 60/909,860 filed Apr. 3, 2007, which is fully incorporated herein by reference.

STATEMENT REGARDING FEDERALLY SPONSORED RESEARCH & DEVELOPMENT

The U.S. Government has certain rights in this invention pursuant to National Science Foundation MRSEC on Polymers Grant No. DMR-0213695, National Science Foundation DMR Polymers Grant No. DMR-0606391, and National Science Foundation NSEC CHM Grant No. DMI-0531171.

BACKGROUND OF THE INVENTION

Fluorescent conjugated polymers have attracted much attention because of their potential optoelectronic and biological applications, such as light-emitting diodes, photovoltaic devices, field-effect transistors, nonlinear optics, and chemical and biological sensors. See, for example, A. J. Heeger, *Angewandte Chemie, International Edition* 2001, 40, 2591-2611. Among the conjugated polymers, polyfluorenes are being considered by many academic and industrial groups as a very promising blue light-emitting material due to their high photoluminescence quantum yield, high thermal and chemical stability, ease of emission color tuning, and facile modification at the 9-position of the fluorene ring without affecting main-chain conjugation. See, for example, U. Scherf and E. J. W. List, *Advanced Materials* (Weinheim, Germany) 2002, 14, 477-487.

Conjugated polymers containing aryl groups have been widely synthesized using various transition-metal-catalyzed or mediated step-growth polymerization techniques. These include Suzuli, Yamamoto, Haghihara/Sonogashira, and Kumada/GRIM techniques. The Suzuki technique is described in, for example, A. D. Schluter, *Journal of Polymer Science, Part A: Polymer Chemistry* 2001, 39, 1533-1556; and D. Marsitzlcy, R. Vestberg, P. Blainey, B. T. Tang, C. J. Hawker, and K. R. Carter, *Journal of the American Chemical Society* 2001, 123, 6965-6972. The Yamamoto technique is described in, for example, T. Yamamoto, *Progress in Polymer Science* 1992, 17, 1153-1205; and T. Yamamoto, A. Morita, Y. Miyazaki, T. Maruyama, H. Wakayama, Z. H. Zhou, Y. Nakamura, T. Kanbara, S. Sasaki, and K. Kubota, *Macromolecules* 1992, 25, 1214-1223. The Haghihara/Sonogashira technique is described in, for example, U. H. F. Bunz, *Chemical Reviews* (Washington, D.C.) 2000, 100, 1605-1644. And the Kumada/GRIM techniques are described, for example, in R. S. Loewe, P. C. Ewbank, J. Liu, L. Zhai, and R. D. McCullough, *Macromolecules* 2001, 34, 4324-4333; R. S. Loewe, S. M. Khersonsky, and R. D. McCullough, *Advanced Materials* (Weinheim, Germany) 1999, 11, 250-253; and U.S. Pat. No. 6,602,974 to McCullough et al.

Due to the synthetic requirement of specific coupling functionalities within the monomer units (boronic acid for Suzuki, terminal alkynes for Sonogashira, and activated halogens for Kumada/GRIM) the synthesis of these materials is often a challenge for chemists. To synthesize polyfluorenes, the Ni(0)-mediated Yamamoto-type polycondensation of dihalogenated fluorene has been preferred and widely used in the literature to produce homopolymers and copolymers prepared from fluorene and its 9-substituted derivatives. See, for example, Y.-H. Kim, Q. Zhao, and S.-K. Kwon, *Journal of Polymer Science, Part A: Polymer Chemistry* 2005, 44, 172-182; J. Cao, Q. Zhou, Y. Cheng, Y. Geng, L. Wang, D. Ma, X. Jing, and F. Wang, *Synthetic Metals* 2005, 152, 237-240; G. Zhou, G. Qian, L. Ma, Y. Cheng, Z. Xie, L. Wang, X. Jing, and F. Wang, *Macromolecules* 2005, 38, 5416-5424; R. Grisorio, P. Mastrorilli, C. F. Nobile, G. Romanazzi, G. P. Suranna, D. Acierno, and E. Amendola, *Macromolecular Chemistry and Physics* 2005, 206, 448-455; J. Lee, H.-J. Cho, B.-J. Jung, N. S. Cho, and H.-K. Shim, *Macromolecules* 2004, 37, 8523-8529; G. Tu, Q. Zhou, Y. Cheng, L. Wang, D. Ma, X. Jing, F. Wang, *Applied Physics Letters* 2004, 85, 2172-2174; X.-H. Zhou, J.-C. Yan, and J. Pei, *Macromolecules* 2004, 37, 7078-7080; L. D. Bozano, K. R. Carter, V. Y. Lee, R. D. Miller, R. DiPietro, and J. C. Scott, *Journal of Applied Physics* 2003, 94, 3061-3068; H.-J. Cho, B.-J. Jung, N. S. Cho, J. Lee, and H.-K. Shim, *Macromolecules* 2003, 36, 6704-6710; U. Asawapirom, and U. Scherf, *Macromolecular Rapid Communications* 2001, 22, 746-749; J.-I. Lee, G. Klaerner, and R. D. Miller, *Chemistry of Materials* 1999, 11, 1083-1088; G. Klaerner, and R. D. Miller, *Macromolecules* 1998, 31, 2007-2009; and Q. Pei and Y. Yang, *Journal of the American Chemical Society* 1996, 118, 7416-7417.

For the polymerization of dibromofluorenes, polymers with a very high number average molecular weight ($M_n$) of up to 200,000 g/mol have been reported. Microwave-assisted coupling procedure has been reported to increase the yield of the polymer and decrease the polymerization time significantly. See, for example, I(. R. Carter, *Macromolecules* 2002, 35, 6757-6759.

The Yamamoto polycondensation reaction involves the use of an equimolar amount of $Ni(1,5\text{-cyclooctadiene})_2$ ($Ni(COD)_2$) as the coupling reagent with respect to the monomer. The advantages of Yamamoto polycondensation are that it can be used effectively along with various chemical functionalities to couple functional dihalogenated monomers giving polymers in good yields. But it is not a very convenient technique for polymerization since it requires large amounts of expensive catalyst ($Ni(COD)_2$ equimolar to monomer), long reaction times, high reaction temperatures, inert atmosphere handling of $Ni(COD)_2$, and the need for excess cyclooctadiene ligand, which is irritating and has an offensive smell.

There is therefore a desire for a polyfluorene synthesis method that avoids the use of cyclooctadiene ligand and uses a catalytic amount of coupling agent and reduced polymerization times and temperatures.

BRIEF DESCRIPTION OF THE INVENTION

The above-described and other drawbacks are alleviated by a method of forming a poly(9,9-disubstituted-fluorene), comprising: reacting a 9,9-disubstituted-fluorene with an alkyl lithium in the presence of a catalytic amount of a nickel amine complex; wherein the 9,9-disubstituted-fluorene comprises leaving groups in the 2-position and the 7-position.

Another embodiment is a method of forming a poly(9,9-disubstituted-fluorene), comprising: reacting a 9,9-disubstituted-fluorene with tert-butyl lithium in the presence of tetrahydrofuran solvent and a catalytic amount of a nickel bipyridine complex; wherein the 9,9-disubstituted-fluorene has the structure

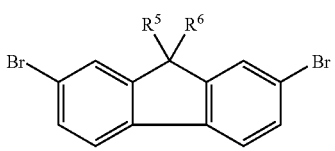

wherein $R^5$ and $R^6$ are independently $C_3$-$C_{12}$ alkyl.

Another embodiment is a method of forming a poly(9,9-disubstituted-fluorene), comprising: reacting 2,7-dibromo-9,9-dihexylfluorene with tert-butyl lithium in the presence of tetrahydrofuran solvent and a catalytic amount of Ni(1,3-bis(diphenylphosphino)propane)(2,2'-bipyridine); wherein the 2,7-dibromo-9,9-dihexylfluorene and tert-butyl lithium are used in a molar ratio of about 1:0.9 to about 1:1.1; and wherein the nickel and the 2,7-dibromo-9,9-dihexylfluorene are used in a molar ratio of about 0.001:1 to about 0.05:1.

These and other embodiments are described in detail below.

DETAILED DESCRIPTION OF THE INVENTION

The present inventors have discovered that poly(9,9-disubstituted-fluorene)s can be synthesized under mild conditions while avoiding the use of stoichiometric coupling agents and large concentrations of cyclooctadiene ligand. In one embodiment, their method of forming a poly(9,9-disubstituted-fluorene) comprises reacting a 9,9-disubstituted-fluorene with an alkyl lithium in the presence of a catalytic amount of a nickel amine complex; wherein the 9,9-disubstituted-fluorene comprises leaving groups in the 2-position and the 7-position.

The invention relates broadly to aryl-aryl coupling reactions. Lithium aryls have been shown to couple photochemically upon irradiation, resulting in the biaryl product. See, for example, E. E. Van Tamelen, J. I. Brauman, and L. E. Ellis, *Journal of the American Chemical Society* 1965, 87, 4964-4965; and E. E. Van Tamelen, J. I. Brauman, and L. E. Ellis, *Journal of the American Chemical Society* 1971, 93, 6141-6144. There have also been few reported instances in literature where Ni and Li reagents have been used together for coupling. The reaction of nickelocene (bis(cyclopentadienyl)nickel) with alkyl lithium and phenyl lithium reagents has been studied and the products analyzed. See, for example, H. Lehmkuhl, S. Pasynkiewicz, R. Benn, and A. Rufinska, *Journal of Organometallic Chemistry* 1982, 240, C27-C29; S. Pasynkiewicz, and H. Lehmkuhl, *Journal of Organometallic Chemistry* 1985, 289, 189-200; and A. Pietrzykowski and S. Pasynkiewicz, *Journal of Organometallic Chemistry* 1992, 440, 401-409. Rieke et al. have shown the formation of metallic nickel by reduction of nickel halides with lithium and naphthalene as an electron carrier. See, S. Inaba, H. Matsumoto, and R. D. Rieke, R. D. *Journal of Organic Chemistry* 1984, 49, 2093-2098. The prepared metallic nickel was shown to couple benzylic halides and polyhalides. Such nickel slurry has been shown to react at room temperature or slightly above with only one equivalent of iodopentafluorobenzene (eq. 1).

See, A. V. Kavaliunas and R. D. Rieke, *Journal of the American Chemical Society* 1980, 102, 5944-5945. The solution contained a mixture of the solvated species $Ni(C_6F_5)_2$ and $NiI_2$. In all the above cases it is important to note that an equimolar amount of Ni compared to the halogenated substrate has been used. The use of Ni reagents as a catalyst for coupling was used in the Kumada coupling reactions wherein the coupling of Grignard reagents with alkyl, vinyl or aryl halides under Ni-catalysis provides an economic transformation. See, for example, K. Tamao, Y. Kiso, K. Sumitani, and M. Kumada, *Journal of the American Chemical Society* 1972, 94, 9268-9269; K. Tamao, K. Sumitani, and M. Kumada, *Journal of the American Chemical Society* 1972, 94, 4374-4376; Y. Kiso, K. Tamao, and M. Kumada, *Journal of Organometallic Chemistry* 1973, 50, C12-C14; A. Minato, K. Tamao, K. Suzuki, and M. Kumada, *Tetrahedron Letters* 1980, 21, 4017-4020; and M. Kumada, *Pure and Applied Chemistry* 1980, 52, 669-679.

The use of Ni as a polymerization catalyst was employed in the GRIM technique for the polymerization of (3-substituted) thiophenes. See, for example, U.S. Pat. No. 6,602,974 to McCullough et al. However, the present inventors have observed that these catalysts are not active for the polymerization of dibromofluorenes.

One embodiment is a method of forming a poly(9,9-disubstituted-fluorene) comprising reacting a 9,9-disubstituted-fluorene with an alkyl lithium in the presence of a catalytic amount of a nickel amine complex; wherein the 9,9-disubstituted-fluorene comprises leaving groups in the 2-position and the 7-position. As used herein, position numbering for the fluorene ring system is as shown below:

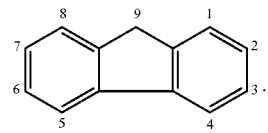

The leaving groups in the 2-position and the 7-position include groups whose covalent bond to the fluorene nucleus is capable of undergoing an oxidative addition to Ni(0) to form a Ni(II) intermediate with a Ni-fluorene bond and a Ni-(leaving group) bond. The two substituents in the 9-position of the fluorene are generally chosen to facilitate solubility of the polyfluorene product in a particular solvent or other medium.

In some embodiments, the 9,9-disubstituted-fluorene has the structure

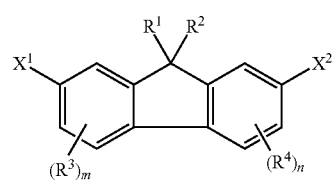

wherein $X^1$ and $X^2$ are independently chloro, bromo, iodo, triflyl, tosyl, mesyl, nonaflyl, or the like (specifically bromo or iodo, more specifically bromo); wherein $R^1$ and $R^2$ are independently unsubstituted or substituted $C_3$-$C_{18}$ hydrocarbyl (specifically $C_3$-$C_{18}$ alkyl, $C_3$-$C_{18}$ perfluoroalkyl, or $C_6$-$C_{18}$ aryl; more specifically $C_3$-$C_{12}$ alkyl), unsubstituted or substituted $C_3$-$C_{18}$ hydrocarbyloxy, unsubstituted or substituted $C_4$-$C_{18}$ acyl, unsubstituted or substituted $C_4$-$C_{18}$ acyloxy, or the like; each occurrence of $R^3$ and $R^4$ is independently $C_1$-$C_{12}$ hydrocarbyl; and m and n are independently 0, 1, 2, or 3 (specifically 0). The terms triflyl, tosyl, mesyl, and nonaflyl are art-recognized and refer to trifluoromethanesulfonyl, p-toluenesulfonyl, methanesulfonyl, and nonafluorobutanesulfonyl groups, respectively. The terms triflate, tosylate, mesylate, and nonaflate are art-recognized and refer to trifluoromethanesulfonate ester, p-toluenesulfonate ester, methanesulfonate ester, and nonafluorobutanesulfonate ester functional groups and molecules that contain said groups, respectively. As used herein, the term "hydrocarbyl", whether used by itself, or as a prefix, suffix, or fragment of another term, refers to a residue that contains only carbon and hydrogen. The residue may be aliphatic or aromatic, straight-chain, cyclic, bicyclic, branched, saturated, or unsaturated. It may also contain combinations of aliphatic, aromatic, straight chain, cyclic, bicyclic, branched, saturated, and unsaturated hydrocarbon moieties. The hydrocarbyl residue, when described as substituted, may contain heteroatoms over and above the carbon and hydrogen members of the substituent residue. Thus, when specifically noted as being substituted, the hydrocarbyl residue may also contain one or more carbonyl groups, amino groups, hydroxyl groups, or the like, or it may contain heteroatoms within the backbone of the hydrocarbyl residue. For example, the term "substituted $C_3$-$C_{18}$ alkyl" includes the poly(ethyleneoxy) group —$(CH_2CH_2O)_4CH_2CH_3$.

In some embodiments, the 9,9-disubstituted-fluorene has the structure

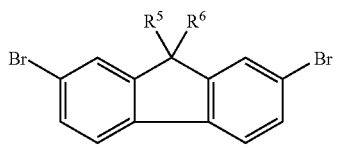

wherein $R^5$ and $R^6$ are independently $C_3$-$C_{12}$ alkyl.

Suitable 9,9-disubstituted-fluorenes include, for example, 2,7-dibromo-9,9-dioctylfluorene, 2,7-dibromo-9,9-didodecylfluorene, 2,7-dibromo-9,9-di(2-ethylhexyl)fluorene, and 2,7-dibromo-9,9-diphenylfluorene. In some embodiments, the 9,9-disubstituted-fluorene is 2,7-dibromo-9,9-dihexylfluorene.

The method comprises reacting the 9,9-disubstituted-fluorene with an alkyl lithium. Suitable alkyl lithiums include, for example, ($C_1$-$C_{12}$)-alkyl lithiums. In some embodiments, the alkyl lithium is n-butyl lithium, sec-butyl lithium, or tert-butyl lithium. In some embodiments, the alkyl lithium is tert-butyl lithium.

The alkyl lithium is typically used in an approximately equimolar amount relative to the 9,9-disubstituted-fluorene. For example, in some embodiments, the 9,9-disubstituted-fluorene and the alkyl lithium are used in a molar ratio of about 1:0.8 to about 1:1.2, specifically about 1:0.9 to about 1:1.1, more specifically about 1:0.95 to about 1:1.05.

The method comprises reacting a 9,9-disubstituted-fluorene with an alkyl lithium in the presence of a catalytic amount of a nickel amine complex. The nickel amine complex is a complex comprising a nickel atom and an amine ligand. Without wishing to be bound by any particular mechanistic theory, the present inventors believe that the nickel center of the nickel amine complex is capable of shuttling between the Ni(0) and Ni(+2) oxidation states, and that the amine ligand is displaceable from the nickel center under the reaction conditions. The amine ligand of the nickel amine complex may be an aliphatic amine ligand or an aromatic amine ligand. In some embodiments, the nickel amine complex comprises an aromatic amine ligand. Suitable aromatic amine ligands include, for example, unsubstituted and substituted 2,2'-bipyridines, unsubstituted and substituted 1,10-phenanthrenes, unsubstituted and substituted 5,6-dihydro-1,10-phenanthrenes, and the like. In some embodiments, the aromatic amine ligand comprises 2,2'-bipyridine. The present inventors have found that polymerization reaction is promoted by using a molar excess of amine ligand relative to nickel. For example, in addition to the amine ligand bound by nickel, the reaction mixture can comprise excess amine ligand in an amount of about 0.1 to about 10 moles per mole of nickel, specifically about 0.2 to about 5 moles per mole of nickel, more specifically about 1 to about 2 moles per mole of nickel. In other words, in these embodiments the molar ratio of nickel to total amine ligand is about 1:1.1 to about 1:11.

In some embodiments, the nickel amine complex comprises a bisphosphine ligand in addition to a nickel atom and an amine ligand. Suitable bisphosphine ligands include, for example, 1,2-bis(diphenylphosphino)ethane, 1,3-bis(diphenylphosphino)propane, 1,2-bis(dicyclohexylphosphino)ethane, 1,3-bis(dicyclohexylphosphino)propane, and the like, and mixtures thereof. In some embodiments, the nickel amine complex comprises 1,3-bis(diphenylphosphino)propane. In some embodiments, the nickel amine complex comprises 2,2'-bipyridine and 1,3-bis(diphenylphosphino)propane.

The nickel amine complex may be provided in its active form (for example, as Ni(1,3-bis(diphenylphosphino)propane)(2,2'-bipyridine)). However, it is often more convenient to generate the nickel complex from a catalyst precursor. For example, the nickel amine catalyst may be generated from catalyst precursors comprising 2,2'-bipyridine and a nickel complex selected from the group consisting of Ni(1,3-bis(diphenylphosphino)propane)Cl$_2$, Ni(1,2-bis(diphenylphosphino)ethane)Cl$_2$, and mixtures thereof. In some embodiments, the nickel complex is Ni(1,3-bis(diphenylphosphino)propane)Cl$_2$. While not wishing to be bound by any particular mechanical theory, the present inventors speculate that the alkyl lithium may also contribute to formation of the active catalyst from the catalyst precursors.

A major advantage of the present method is that the nickel amine complex is used in a catalytic amount. In other words, the molar amount of nickel amine complex (as nickel metal) is less than the molar amount of 9,9-disubstituted-fluorene monomer. Typically, the molar amount of nickel amine complex is substantially less than the molar amount of 9,9-disubstituted-fluorene monomer. For example, in some embodiments, the nickel and the 9,9-disubstituted-fluorene are used in a molar ratio of about 0.001:1 to about 0.1:1, specifically about 0.002:1 to about 0.05:1, more specifically about 0.005:1 to about 0.02:1.

In some embodiments, the polymerization is conducted in the presence of a solvent. The solvent is typically unreactive toward the alkyl lithium and nickel amine complex, and it is a good solvent for the product polyfluorene. Suitable solvents include, for example, tetrahydrofuran, 1,4-dioxane, and mixtures thereof. In some embodiments, the solvent is tetrahydrofuran.

The polymerization reaction may be conducted under relatively mild conditions. Thus, in some embodiments, the polymerization method comprises combining the 9,9-disubstituted-fluorene, the nickel amine complex precursors (for example, 2,2'-bipyridine and Ni(1,3-bis(diphenylphosphino)propane)Cl$_2$), and anhydrous solvent (for example, tetrahydrofuran) to form a first mixture; agitating the first mixture to form a homogeneous solution; adjusting the temperature of the homogeneous solution to about −50 to about 20° C., specifically about −20 to about 10° C.; adding the alkyl lithium (for example, tert-butyl lithium) to the temperature-adjusted homogeneous solution to form a second mixture; and gradually warming the second mixture to about 15 to about 50° C., specifically about 20 to about 30° C., to effect the polymerization. The polymerization can therefore be conducted at or near room temperature, whereas other polyfluorene synthesis methods typically require polymerization temperatures substantially greater than room temperature.

The method may, optionally, further comprise isolating the poly(9,9-disubstituted-fluorene). For example, when the polymerization is conducted in a solvent capable of maintaining the product polyfluorene in solution, the polyfluorene may be isolated by combining the polyfluorene solution with an antisolvent for the polyfluorene, such as a lower alcohol or water. In some embodiments, the polyfluorene is isolated by combining the polyfluorene solution with an aqueous solution, specifically an acidic aqueous solution, to precipitate the poly(9,9-disubstituted-fluorene), and washing the precipitated poly(9,9-disubstituted-fluorene) with one or more solvents such as alkanes (for example, hexanes), lower alcohols (for example, methanol or ethanol), ketones (for example, acetone or methyl ethyl ketone), and the like, and mixtures thereof.

The method is capable of forming high molecular weight polyfluorenes. For example, in some embodiments, the poly (9,9-disubstituted-fluorene) has a number average molecular weight of about 2,000 to about 200,000 atomic mass units, specifically about 5,000 to about 150,000 atomic mass units, more specifically about 10,000 to about 100,000 atomic mass units, still more specifically about 20,000 to about 50,000 atomic mass units. Polydispersity is the ratio of the weight average molecular weight to the number average molecular weight. In some embodiments, the poly(9,9-disubstituted-fluorene) has a polydispersity of about 1.5 to about 3, specifically about 1.8 to about 2.5, more specifically about 1.9 to about 2.2, still more specifically about 2 to about 2.1. Number average molecular weight and weight average molecular weight may be determined by methods known in the art, including, for example, by gel permeation chromatography using polystyrene standards.

One embodiment is a method of forming a poly(9,9-disubstituted-fluorene), comprising: reacting a 9,9-disubstituted-fluorene with tert-butyl lithium in the presence of tetrahydrofuran solvent and a catalytic amount of a nickel bipyridine complex; wherein the 9,9-disubstituted-fluorene has the structure

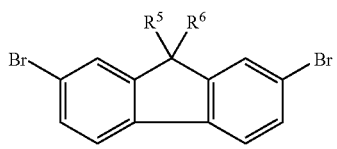

wherein $R^5$ and $R^6$ are independently $C_3$-$C_{12}$ alkyl.

Another embodiment is a method of forming a poly(9,9-disubstituted-fluorene), comprising: reacting 2,7-dibromo-9,9-dihexylfluorene with tert-butyl lithium in the presence of tetrahydrofuran solvent and a catalytic amount of Ni(1,3-bis(diphenylphosphino)propane)(2,2'-bipyridine); wherein the 2,7-dibromo-9,9-dihexylfluorene and tert-butyl lithium are used in a molar ratio of about 1:0.9 to about 1:1.1; and wherein the nickel and the 2,7-dibromo-9,9-dihexylfluorene are used in a molar ratio of about 0.001:1 to about 0.1:1.

The invention is further illustrated by the following non-limiting examples.

EXAMPLE

In a reactor flask the monomer 9,9-dihexyl-2,7-dibromofluorene (250 milligrams, 0.51 millimoles), Ni(1,3-bis(diphenylphospino)propane)Cl$_2$ ("Ni(dppp)Cl$_2$"; 4 milligrams, 7.38 micromoles) and 2,2'-bipyridine (2.8 milligrams, 17.93 micromoles) were added followed by addition of anhydrous tetrahydrofuran (2 milliliters). The flask was sealed under nitrogen and the reaction was cooled with to 0° C. under ice bath with stirring. To the cooled reaction mixture 0.3 milliliters of tert-BuLi solution (0.48 millimoles, 1.6 moles/liter solution in pentane) was added drop-wise with a syringe. The resulting mixture was allowed to warm gradually to room temperature and allowed to stir for 20 hours at room temperature. The polymer was precipitated by adding the solution drop-wise into dilute aqueous hydrochloride acid (0.1 N) and the polymer was filtered. The polymer was washed with acetone to remove unreacted monomer and oligomers and dried to obtain the polyfluorene product (90 milligrams, 36%, $M_n$=33,393, PDI=2.07) as a yellow powder. The $^1$H and $^{13}$C NMR spectra of the polymer are similar to those reported for poly(9,9-dihexyl fluorene) synthesized using Yamamoto polycondensation techniques.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A method of forming a poly(9,9-disubstituted-fluorene), comprising:
   reacting a 9,9-disubstituted-fluorene with an alkyl lithium in the presence of a catalytic amount of a nickel amine complex; wherein the 9,9-disubstituted-fluorene comprises leaving groups in the 2-position and the 7-position.

2. The method of claim 1, wherein the 9,9-disubstituted-fluorene has the structure

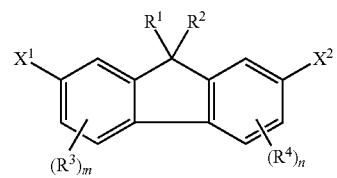

wherein $X^1$ and $X^2$ are independently selected from the group consisting of chloro, bromo, iodo, triflyl, tosyl, mesyl, and nonaflyl; wherein $R^1$ and $R^2$ are independently selected from the group consisting of unsubstituted or substituted $C_3$-$C_{18}$ hydrocarbyl, unsubstituted or substituted $C_3$-$C_{18}$ hydrocarbyloxy, unsubstituted or substituted $C_4$-$C_{18}$ acyl, and unsubstituted or substituted $C_4$-$C_{18}$ acyloxy; each occurrence of $R^3$ and $R^4$ is independently $C_1$-$C_{12}$ hydrocarbyl; and m and n are independently 0, 1, 2, or 3.

3. The method of claim 1, wherein the 9,9-disubstituted-fluorene has the structure

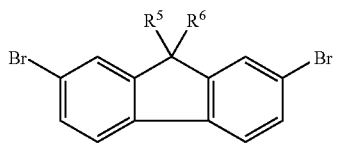

wherein $R^5$ and $R^6$ are independently $C_3$-$C_{12}$ alkyl.

4. The method of claim 1, wherein the 9,9-disubstituted-fluorene is selected from the group consisting of 2,7-dibromo-9,9-dioctylfluorene, 2,7-dibromo-9,9-didodecylfluorene, 2,7-dibromo-9,9-di(2-ethylhexyl)fluorene, and 2,7-dibromo-9,9-diphenylfluorene.

5. The method of claim 1, wherein the 9,9-disubstituted-fluorene is 2,7-dibromo-9,9-dihexylfluorene.

6. The method of claim 1, wherein the alkyl lithium is a ($C_1$-$C_{12}$)-alkyl lithium.

7. The method of claim 1, wherein the alkyl lithium is selected from the group consisting of n-butyl lithium, sec-butyl lithium, and tert-butyl lithium.

8. The method of claim 1, wherein the alkyl lithium is tert-butyl lithium.

9. The method of claim 1, wherein the 9,9-disubstituted-fluorene and the alkyl lithium are used in a molar ratio of about 1:0.8 to about 1:1.2.

10. The method of claim 1, wherein the nickel amine complex comprises an aromatic amine ligand selected from the group consisting of unsubstituted and substituted 2,2'-bipyridines, unsubstituted and substituted 1,10-phenanthrenes, and unsubstituted and substituted 5,6-dihydro-1,10-phenanthrenes.

11. The method of claim 1, wherein the nickel amine complex comprises 2,2'-bipyridine.

12. The method of claim 1, wherein the 9,9-disubstituted-fluorene, the alkyl lithium, and the nickel amine complex are present in a reaction mixture, and wherein the reaction mixture further comprises excess amine ligand in an amount of about 0.1 to about 10 moles per mole of nickel.

13. The method of claim 1, wherein the nickel amine complex comprises a bisphosphine ligand.

14. The method of claim 1, wherein the nickel amine complex comprises 1,3-bis(diphenylphosphino)propane.

15. The method of claim 1, wherein the nickel amine complex comprises 2,2'-bipyridine and 1,3-bis(diphenylphosphino)propane.

16. The method of claim 1, wherein the nickel amine complex is generated from catalyst precursors comprising 2,2'-bipyridine and a nickel complex selected from the group consisting of Ni(1,3-bis(diphenylphosphino)propane)Cl$_2$, Ni(1,2-bis(diphenylphosphino)ethane)Cl$_2$, and mixtures thereof.

17. The method of claim 16, wherein the nickel complex is Ni(1,3-bis(diphenylphosphino)propane)Cl$_2$.

18. The method of claim 1, wherein the nickel and the 9,9-disubstituted-fluorene are used in a molar ratio of about 0.001:1 to about 0.1:1.

19. The method of claim 1, wherein the 9,9-disubstituted-fluorene, the alkyl lithium, and the nickel amine complex are reacted in the presence of a solvent.

20. The method of claim 19, wherein the solvent is tetrahydrofuran.

21. The method of claim 1, further comprising isolating the poly(9,9-disubstituted-fluorene).

22. The method of claim 21, wherein reacting the 9,9-disubstituted-fluorene with the alkyl lithium in the presence of the catalytic amount of a nickel amine complex generates a solution of the poly(9,9-disubstituted-fluorene); and wherein isolating the poly(9,9-disubstituted-fluorene) comprises combining the solution of the poly(9,9-disubstituted-fluorene) with an aqueous solution to precipitate the poly(9,9-disubstituted-fluorene), and washing the precipitated poly (9,9-disubstituted-fluorene) with at least one solvent selected from the group consisting of alkanes, alcohols, ketones, and mixtures thereof.

23. The method of claim 1, wherein the poly(9,9-disubstituted-fluorene) has a number average molecular weight of about 2,000 to about 200,000 atomic mass units.

24. The method of claim 1, wherein the poly(9,9-disubstituted-fluorene) has a polydispersity of about 1.5 to about 3.

25. The method of claim 1,
wherein the alkyl lithium comprises tert-butyl lithium;
wherein the 9,9-disubstituted-fluorene, the alkyl lithium, and the nickel amine complex are reacted in the presence of a solvent comprising tetrahydrofuran;
wherein the nickel amine complex comprises a nickel bipyridine complex; and
wherein the 9,9-disubstituted-fluorene has the structure

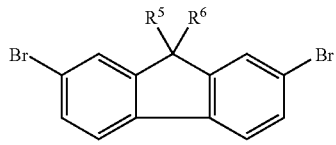

wherein $R^5$ and $R^6$ are independently $C_3$-$C_{12}$ alkyl.

26. The method of claim 1,
wherein the 9,9-disubstituted fluorine comprises 2,7-dibromo-9,9-dihexylfluorene;
wherein the alkyl lithium comprises tert-butyl lithium;
wherein the 9,9-disubstituted-fluorene, the alkyl lithium, and the nickel amine complex are reacted in the presence of a solvent comprising tetrahydrofuran;
wherein the nickel amine complex comprises Ni(1,3-bis(diphenylphosphino)propane)(2,2'-bipyridine);
wherein the 2,7-dibromo-9,9-dihexylfluorene and tert-butyl lithium are used in a molar ratio of about 1:0.9 to about 1:1.1; and
wherein the nickel and the 2,7-dibromo-9,9-dihexylfluorene are used in a molar ratio of about 0.001:1 to about 0.1:1.

* * * * *